United States Patent [19]

Moon

[11] Patent Number: 5,426,753
[45] Date of Patent: Jun. 20, 1995

[54] MEMORY DECODING SYSTEM FOR PORTABLE DATA TERMINAL

[75] Inventor: Sung W. Moon, Seoul, Rep. of Korea

[73] Assignee: Gold Star Co., Ltd., Seoul, Rep. of Korea

[21] Appl. No.: 232,577

[22] Filed: Apr. 25, 1994

Related U.S. Application Data

[63] Continuation of Ser. No. 751,824, Aug. 30, 1991, abandoned.

[30] Foreign Application Priority Data

Aug. 30, 1990 [KR] Rep. of Korea ............... 13169/1990

[51] Int. Cl.⁶ .......................... G06F 12/00; G11C 7/00
[52] U.S. Cl. ................................. 395/400; 395/425; 365/230.06; 365/230.03
[58] Field of Search .................. 395/400, 425; 365/230.03, 230.06; 364/200, 900, DIG. 1, DIG. 2

[56] References Cited

U.S. PATENT DOCUMENTS

| | | | |
|---|---|---|---|
| 4,290,105 | 9/1981 | Cichelli et al. | 395/575 |
| 4,302,820 | 11/1981 | Struger et al. | 395/375 |
| 4,443,865 | 4/1984 | Schultz et al. | 395/425 |
| 4,475,176 | 10/1984 | Ishii | 395/400 |
| 4,617,650 | 10/1986 | Morino et al. | 365/195 |
| 4,821,182 | 4/1989 | Leininger | 395/425 |
| 4,908,748 | 3/1990 | Pathak et al. | 395/400 |
| 4,961,172 | 10/1990 | Shubat et al. | 365/230.06 |

*Primary Examiner*—Jack B. Harvey
*Assistant Examiner*—Jack A. Lane
*Attorney, Agent, or Firm*—Finnegan, Henderson, Farabow, Garrett & Dunner

[57] ABSTRACT

A memory decoding system for a portable data terminal includes a memory controller, a memory storage, a first selection signal generator, and a second selection signal generator. The memory controller generates address signals and data signals. The memory storage is divided into a plurality of memory regions, and is controlled in such a manner as to write and read for the specified uses through the memory controller. The first selection signal generator outputs memory selecting signals to select one memory type of the memory storage. The second selection signal generator generates memory selecting signals to select another memory type of the memory storage. The portable terminal can be formed into a more compact type.

4 Claims, 3 Drawing Sheets

MEMORY DECODING SYSTEM FOR PORTABLE DATA TERMINAL

This application is a continuation of U.S. application Ser. No. 07/751,824 filed Aug. 30, 1991, now abandoned.

BACKGROUND OF THE INVENTION

1. Field of the Invention

The present invention relates to a memory decoding system, and particularly to a memory decoding system for use on a portable data terminal.

2. Discussion of the Related Art

A portable data terminal is restricted in its board size, and therefore, all the circuits of the terminal have to be simplified as much as possible. Further, as a dc power source is used, the number of the circuit components (integrated circuit elements) has to be reduced to a minimum in order to prevent the unnecessary consumption of power. The memory decoding system of a portable data terminal includes a separate ROM as the main memory device and a plurality of RAMs together with a microprocessor. These components are provided in such a manner to form the main internal device, internal and external peripheral devices, and a data terminal.

The ROM is primarily used to store the system program, and the plurality of the RAMs are used for carrying out jobs and for operating the programs. Therefore, if the ROM and RAM are assigned with separate addresses, the system program becomes complicated, and can lower the processing performance of the microprocessor owing to the inherent characteristics of the portable data terminal. Therefore, it is required that the ROM and RAM be assigned with addresses in an integrated form.

Generally, the memory decoding system for the portable data terminal uses customized chips as in ASIC (Application Specific Integrated Circuit), and therefore, its construction and operating principles may be difficult to determine. For example, circuit No. 75 which is disclosed in a technical reference manual for Model-20, which is a product of Norland Company of England, includes a memory decoding system for a portable data terminal. The large numbers of gates and logic ICs in the system make it difficult to form compact products.

In that memory decoding system, the memory banks can be selected by a switch capable of three settings for selecting three modes of the memory banks by means of the system program, and the ROM and the RAM are connected to the memory decoding system. However, more detailed exact operating principles of the system cannot be determined.

In forming the memory section as the main memory device for the portable data terminal, if the ROM and the RAM are assigned with independent addresses, as in the conventional cases, the program for operating them becomes complicated, and as a result the processing capability of the microprocessor is reduced. Also, due to the restriction in the board size, all the circuits have to be compactly designed. Further, the number of chips used has to be reduced as much as possible.

SUMMARY OF THE INVENTION

The present invention is intended to overcome the above described disadvantages of the conventional technique. Therefore, it is the object of the present invention to provide a memory decoding system which can be used in a portable data terminal in a convenient manner by mapping the memory in such a manner that the RAMs and the ROM forming the memory section are assigned with addresses in an integral form.

In achieving the above object and in accordance with the purpose of the invention, as embodied and broadly described herein, the system of the present invention includes a microprocessor for generating address signals having a required bit number, data signals having a required bit number, memory request signals, and memory read/write signals; a memory section having a ROM and a plurality of RAMs, an address map having a system ROM region, a reserve region, a user RAM region, and a system RAM region in an integral form for the whole system, and connected through a common bus (for address and data) to the microprocessor; an OR gate for OR-computing the uppermost two address signals; a RAM selection signal generating section for outputting a predetermined number of RAM selecting signals after receipt of a predetermined number of the uppermost address signals (excluding the uppermost two addresses), and using the output signals of the OR gate, the memory request signals, and the power-on driving voltage as the enabling signals; a NAND gate section for receiving a predetermined number of the uppermost address signals (including the uppermost two addresses inputted into the OR gate computing section); and a ROM selection signal generating section having an OR gate for OR-computing the output signals of the NAND gate and the memory request signals, and for outputting the computed signals as the ROM selecting signals.

BRIEF DESCRIPTION OF THE DRAWINGS

The manner by which the above object and other objects, features, and advantages of the present invention are attained will become fully apparent from the following detailed description of the present invention when considered with reference to the attached drawings in which.

DETAILED DESCRIPTION

Figure 1:
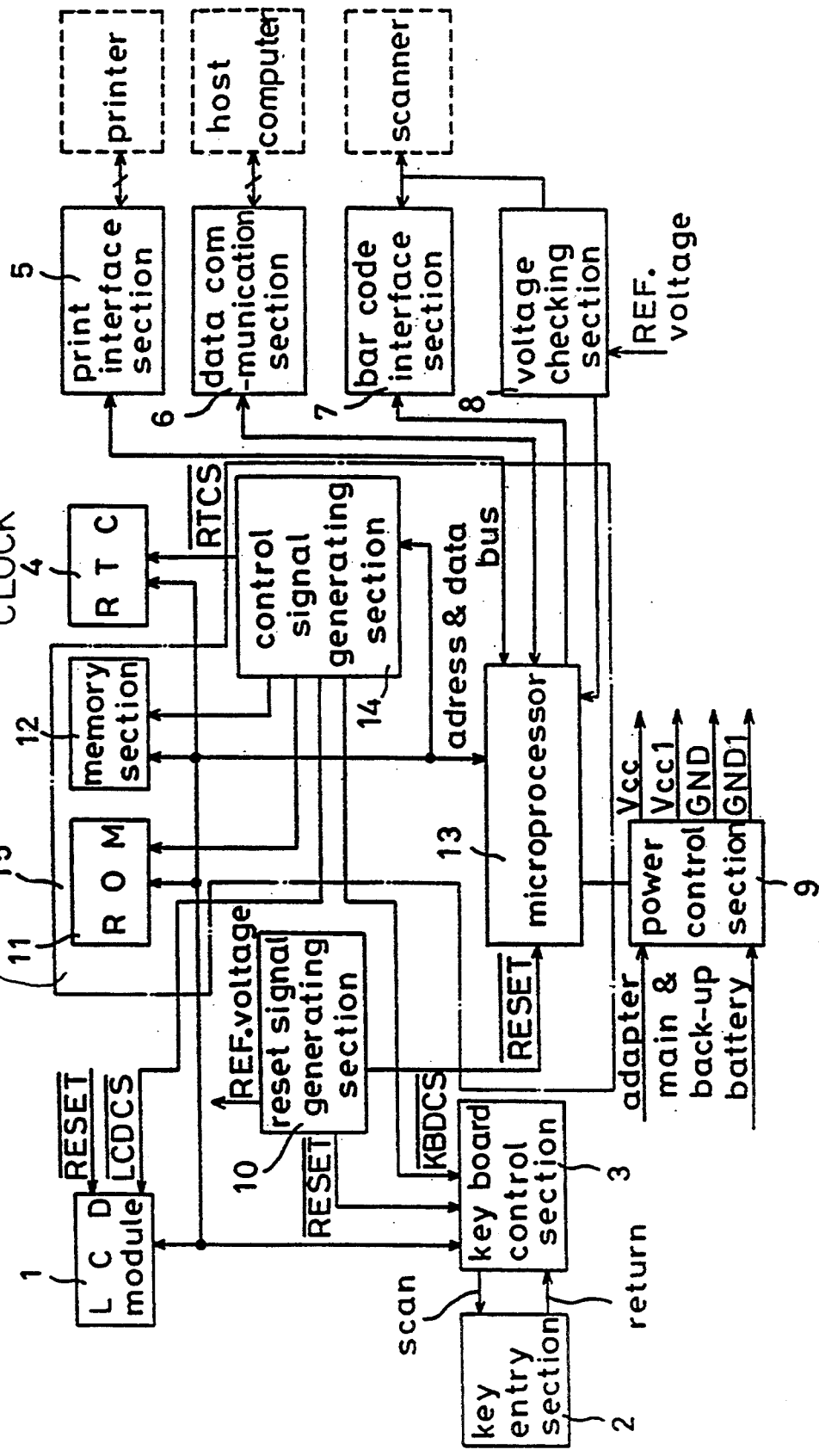
FIG. 1 is a block diagram showing an embodiment of the conventional portable data terminal.

FIG. 1 is a block diagram showing an embodiment of the conventional portable data terminal, and is provided to assist in the understanding of the apparatus of the present invention. As shown in FIG. 1, the data terminal includes an LCD (liquid crystal display) module 1 for displaying characters and graphs after receipt of data based on the system program, a key entry section 2 including a plurality of letter keys and numeral keys, and a key board control section 3 for scanning and decoding the key state of the entry section 2 in order to send the letter and numeral key signals from the key entry section to the LCD module 1. An RTC section (real time clock section) 4 generates the timing signals required in the portable data terminal, and is capable of showing year, month and date, including leap year, automatically.

A print interface section 5 sends the data to be printed to a separate external printer, and a data communication section 6 (e.g. RS-232 or uPD-4711) transmits the data (to be transmitted and received) to an external host computer in series.

A bar code interface section 7 may be provided for inputting bar codes (including black and white bars) through a separate scanner, and a voltage checking section 8 displays a low voltage state upon finding the voltage to be lower than a reference voltage by checking the state of a battery used as the driving power source for the portable data terminal.

A power control section 9 supplies the power source of an adaptor to the respective sections of the memory decoding system, the adaptor being used for converting the respective outputs of a main battery, a back-up battery, and an external ac power source to the appropriate dc power. A reset signal generating section 10 supplies reset signals to the microprocessor key board control section 3 and to the LCD module 1 in accordance with the selections by the user.

Various memories are provided including a ROM 11 for storing the system program and a memory section 12 including a plurality of RAMs for operating user programs. A microprocessor 13 controls the system operations by using the system program stored in the ROM 11, and a control signal generating section 14 is connected through an address/data bus to the microprocessor 13 and generates various control and memory selection signals in order to operate the system after receipt of address signals from the microprocessor 13.

In order to prevent the squandering of the power for purposes other than the above described functions, the power control section 9 is automatically turned off if the system remains unused for a predetermined period of time.

The ROM 11, memory section 12, microprocessor 13, and the control signal generating section 14 form an integral system called by the general name of memory decoding system 15. According to the present invention, the memory decoding system 15 is properly adapted to the portable data terminal with the minimum number of chips, and the preferred embodiment of the present invention based on this principle will be illustrated in FIGS. 2 and 3.

Figure 2:
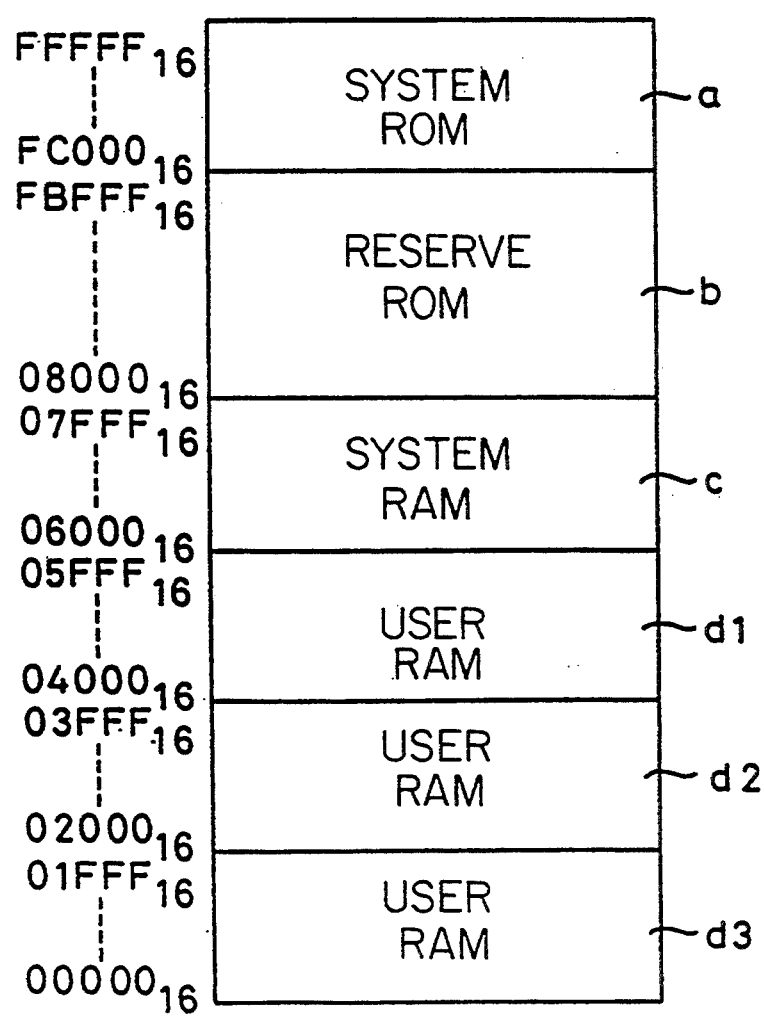
FIG. 2 illustrates an embodiment of a memory address map according to the present invention.

FIG. 2 illustrates an address map structure of the ROM 11 and the memory section 12 including a plurality of RAMs according to the present invention. The addresses that can be designated by the microprocessor 13 range from $00000_{16}$ through $FFFFF_{16}$ as represented in the hexadecimal number system according to the present embodiment. Further, the total number of addresses are divided into a system ROM region "a," a reserve ROM region "b," a system RAM region "c," and user regions "$d_1$-$d_3$."

Figure 3:
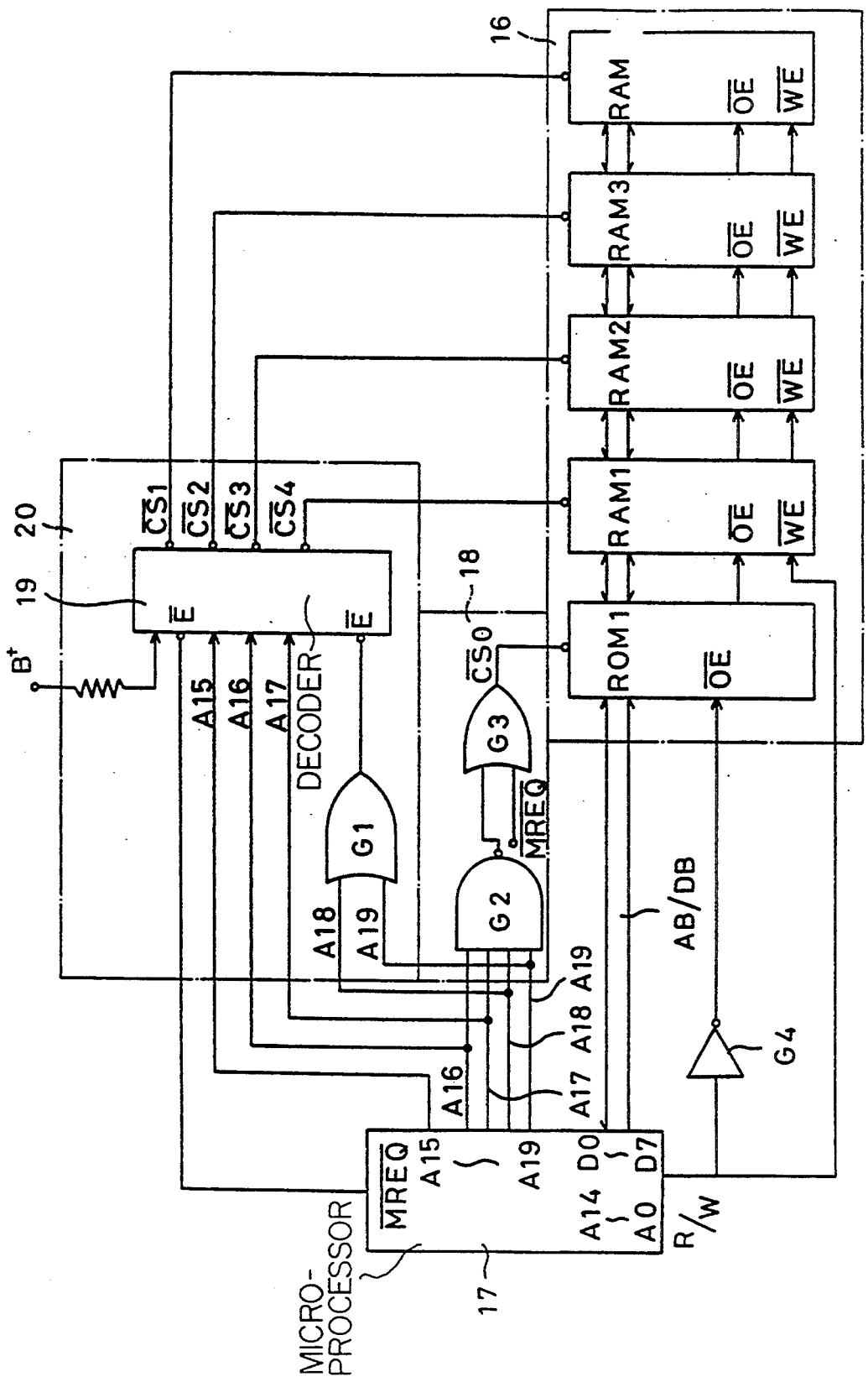
FIG. 3 illustrates a circuit of the memory decoding system of a portable data terminal according to the present invention.

FIG. 3 illustrates the memory decoding system 15 of the portable data terminal employing the memory address map of FIG. 2. As shown in this drawing, the memory decoding system 15 includes a memory section 16 including a $ROM_1$ (64 Kbit may be used) including the addresses of the system ROM region "a" and the reserve ROM region "b," and 4 RAMs ($RAM_1$-$RAM_4$) (32 Kbit SRAMs may be used) having the addresses of the system RAM region "c" and the user RAM regions "$d_1$-$d_3$." A microprocessor 17 (for example, model V25 of NEC may be used) is included for generating internal 16-bit and external 8-bit signals containing address signals $A_o$-$A_{19}$, memory request signal MREQ, 8 data signals $D_o$-$D_7$ and a memory read/write signal R/W. A first selection signal generating section 18 is included having a NAND gate $G_2$ receiving the four uppermost address signals $A_{16}$-$A_{19}$ of the address signals outputted from the microprocessor 17, and an OR gate $G_3$ receiving the output of the NAND gate $G_2$ and the memory request signal, /MREQ, from the microprocessor 17. The output signal of the OR gate $G_3$ is transmitted to $ROM_1$ of the memory section 16 in the form of a chip selecting signal $\overline{CS}_o$.

The memory decoding system further includes a second selection signal generating section 20 including an OR gate $G_1$ and a decoder 19. The OR gate $G_1$ receives the uppermost two address signals $A_{18}$-$A_{19}$ and the decoder 19 receives three of the upper address signals $A_{15}$-$A_{17}$. The decoder 19 receives the following signals as the enabling signals: memory request signal/MREQ, output signal of the OR gate $G_1$ and the system turning-on driving voltage $B^+$. Also, the decoder 19 generates chip selecting signals $\overline{CS}_1$-$\overline{CS}_4$ for the 4 RAMs ($RAM_1$-$RAM_4$) of the memory section 16. Further, the microprocessor 17 is connected to the memory section 16 by supplying the memory read/write signal R/W as write enabling signals $\overline{WE}$ to $ROM_1$ and RAMs ($RAM_1$-$RAM_4$) of the memory section 16, and by supplying the memory read/write signal R/W through an inverting device $G_4$ as an output enabling signal $\overline{OE}$.

The apparatus of the present invention constituted as described above will now be described as to its operations.

As shown in FIG. 3, the memory decoding system generates internal 16-bit signals and external 8-bit signals including the memory request signal /MREQ, the memory read/write signal R/W, the address signals $A_o$-$A_{19}$ and the data signals $D_o$-$D_7$ through the microprocessor 17. The four uppermost address signals $A_{16}$-$A_{19}$ of the addresses $A_o$-$A_{19}$ are supplied to the NAND gate $G_2$ of the first selection signal generating section 18, and the output signals of the NAND gate $G_2$ are inputted into one of the input terminals of the OR gate $G_3$. The other input terminal of the OR gate $G_3$ receives the memory request signal /MREQ, and, after carrying out the logic operation in this state, the OR gate $G_3$ supplies a chip selecting signal $\overline{CS}_o$ to $ROM_1$ of the memory section 16.

In addition to the address signals $A_o$-$A_{19}$ generated by the microprocessor 17, the two uppermost address signals $A_{18}$ and $A_{19}$ are supplied to the two input terminals of the OR gate $G_1$ of the second selection signal generating section 20, and the three address signals $A_{15}$-$A_{17}$ are inputted into the input terminal of the decoder 19 (3×8). Under this condition, the decoder 19 outputs chip selecting signals $\overline{CS}_1$-$\overline{CS}_4$ to the respective RAMs ($RAM_1$-$RAM_4$) of the memory section 16 upon receipt of the enabling signals.

More specifically, when the logic values of the address signals $A_{16}$-$A_{19}$ are all "1," the output signals of the NAND gate $G_2$ of the first selection signal generating section 18 will have the value of "0." Under this condition, if the memory signal /MREQ is in the active low state, the output signals of the OR gate $G_3$ will have the logic value of "0." Accordingly, an active low signal as the chip selecting signal $\overline{CS}_o$ is supplied to $ROM_1$ of the memory section 16, and it becomes possible for the microprocessor 17 to access the data in $ROM_1$.

If the address signals $A_{18}$ and $A_{19}$ and the memory request signal MREQ have the logic value of "0," and if the driving voltage $B^+$ has the logic value of "1," the decoder 19 will be placed in a chip enable state, so that the chip selecting signals $\overline{CS}_1$-$\overline{CS}_4$ are supplied to the memory section 16 after combining and mixing the address signals $A_{15}$-$A_{17}$ which are the input signals. Under this condition, only one of the chip selecting signals $\overline{CS_1}$-$\overline{CS_4}$ is placed in an active low state, and only one of the RAMs (RAM$_1$-RAM$_4$) is placed in a chip enable state. Accordingly, the microprocessor 17 can access the required data from the enabled RAM. Consequently, depending on the logic values of the address signals $A_{18}$ and $A_{19}$, only one of the RAMs (RAM$_1$-RAM$_4$) and the ROM of the memory section is enabled. Further, if the read/write signal R/W of the microprocessor 17 is in a low state, ROM$_1$ and the RAMs (RAM$_1$-RAM$_4$) are placed in a write enable state, while, if the read/write signals R/W are in a high state, ROM$_1$ and the RAMs (RAM$_1$-RAM$_4$) are placed in an output enable state.

The present invention achieves the following results. First, the longitudinal address of the system is divided into a plurality of address regions in accordance with the uses of the ROM and a plurality of the RAMs (forming the memory section), thus alleviating the load for the microprocessor. Therefore, the utilization of the memory section of the portable data terminal is maximized. Second, the memory decoding system is constituted with the minimum number of elements by utilizing an efficient memory map structure. Accordingly, the memory decoding system is sufficiently compact to fit into the characteristics of the portable data terminal, and the otherwise unnecessary squandering of the dc power source can be prevented.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A memory decoding system for portable data terminal, comprising:
    memory storing means including a plurality of memory regions having a ROM for storing a system program and a plurality of RAMs;
    means for selectively generating a memory request signal, address signals and data signals to read data from said memory storing means and to store data into said memory storing means;
    first signal generating means for generating first memory selecting signals in order to select one of said memory regions of said memory storing means, said first signal generating means being responsive to a first portion of bits of said address signals and the memory request signal; and
    second signal generating means for generating second memory selecting signals in order to select another one of said memory regions of said memory storing means, said second signal generating means being responsive to a second portion of bits of said address signals, said memory request signal, a third portion of bits of said address signals, and a driving voltage signal, said second portion of bits corresponding to different address signals than said first portion of bits,
    wherein said first signal generating means and said second signal generating means divides said memory storing means into a system ROM region, a reserve ROM region, a system RAM region, and at least one user RAM region, said second signal generating means including a logic gate responsive to a sub-portion of bits from said second portion of bits of said address signals for producing an output signal, and a decoder receiving a remaining sub-portion of bits from said second portion of bits, the output signal of said logic gate, said memory request signal and said driving voltage signal for generating the second memory selecting signals,
    wherein said first signal generating means comprises:
    a first logic gate responsive to said first portion of bits of said address signals for producing an output signal; and
    a second logic gate for generating a signal in order to select one of said ROM regions of said memory storing means, said second logic gate receiving the output signal of said first logic gate and said memory request signal.

2. The memory decoding system for portable data terminal as claimed in claim 1, wherein said first logic gate is a NAND gate.

3. The memory decoding system for portable data terminal as claimed in claim 1, wherein said second logic gate is an OR gate.

4. The memory decoding system for portable data terminal as claimed in claim 1, wherein said logic gate is an OR gate.

* * * * *